(12) United States Patent
Low et al.

(10) Patent No.: US 6,655,969 B2
(45) Date of Patent: *Dec. 2, 2003

(54) CONTACT ELEMENTS

(75) Inventors: Kok Wah Low, Bukit Mertajam (MY); Hwan Ming Wang, Penang (MY); Lin Ping Goh, Selangor (MY)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/374,865

(22) Filed: Feb. 25, 2003

(65) Prior Publication Data

US 2003/0143877 A1 Jul. 31, 2003

Related U.S. Application Data

(62) Division of application No. 09/737,212, filed on Dec. 14, 2000.

(51) Int. Cl.[7] .............................................. H01R 12/00
(52) U.S. Cl. ........................................................ 439/82
(58) Field of Search ........................ 439/82, 862, 843, 439/55, 81, 844, 751, 756

(56) References Cited

U.S. PATENT DOCUMENTS

| | | | | |
|---|---|---|---|---|
| 3,742,157 A | * | 6/1973 | Leposavic | 200/5 A |
| 3,777,303 A | | 12/1973 | McDonough | 339/258 R |
| 4,664,309 A | | 5/1987 | Allen et al. | 228/180.2 |
| 4,950,173 A | * | 8/1990 | Minemura et al. | 439/82 |
| 4,957,453 A | | 9/1990 | Owen | 439/422 |
| 5,152,695 A | | 10/1992 | Grabbe et al. | 439/71 |
| 5,199,879 A | * | 4/1993 | Kohn et al. | 439/82 |
| 5,362,244 A | | 11/1994 | Hanson et al. | 439/82 |
| 5,632,631 A | | 5/1997 | Fjelstad et al. | 430/82 |
| 5,733,133 A | | 3/1998 | Matsumura | 439/82 |
| 5,934,914 A | * | 8/1999 | Fjelstad et al. | 439/82 |
| 5,957,739 A | * | 9/1999 | Bianca et al. | 439/885 |
| 5,960,537 A | | 10/1999 | Vicich et al. | 29/843 |
| 6,142,794 A | * | 11/2000 | Amberg | 439/82 |
| 6,572,389 B2 | * | 6/2003 | Low et al. | 439/82 |

* cited by examiner

*Primary Examiner*—Renee Luebke
*Assistant Examiner*—Felix O. Figueroa
(74) *Attorney, Agent, or Firm*—Schwegman, Lundberg, Woessner & Kluth, P.A.

(57) ABSTRACT

A circuit board assembly having a circuit board including a via, and a contact element positioned adjacent to the via for providing electrical attachment of the pin to the via of the circuit board.

22 Claims, 8 Drawing Sheets

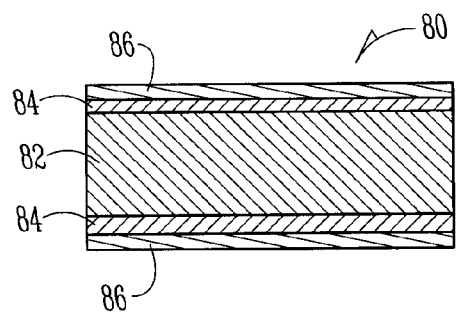
Fig. 6
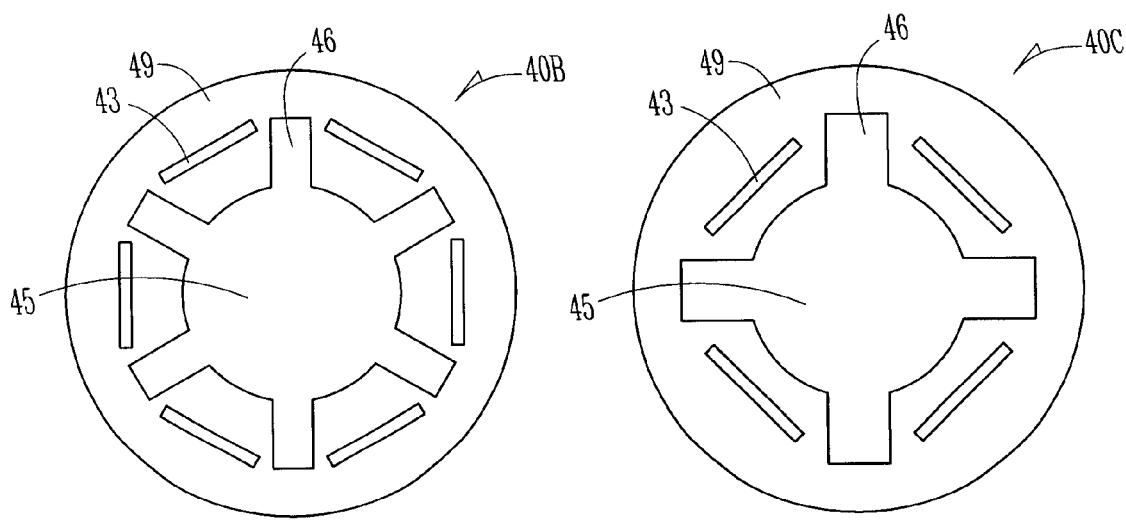
Fig. 7
Fig. 8

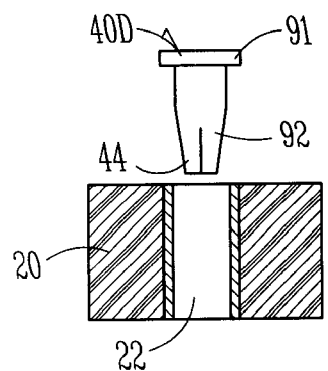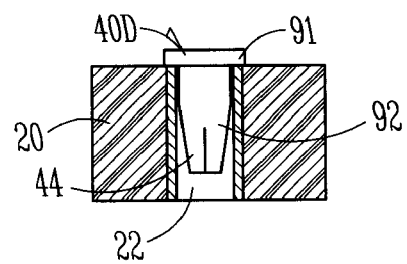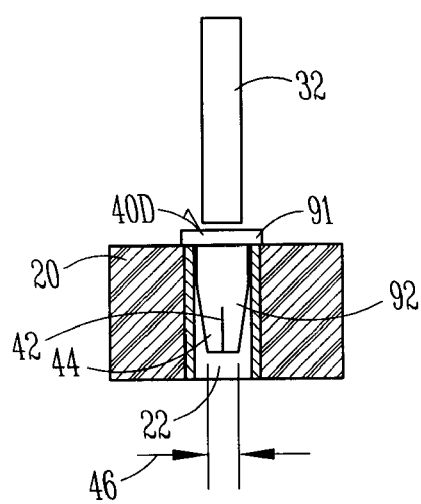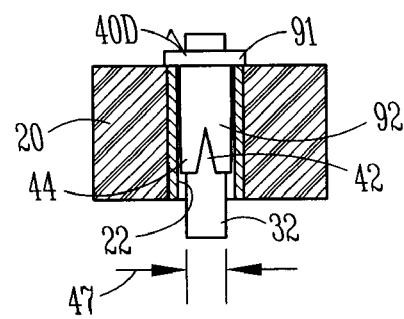

CONTACT ELEMENTS

This application is a divisional of U.S. patent application Ser. No. 09/737,212, filed Dec. 14, 2000, which is incorporated herein by reference in its entirety.

BACKGROUND

Embodiments of the invention relate to circuit boards, socket mounts, and contact pins.

Burn-in is a semiconductor industry manufacturing process for screening out non-functional chips or devices. The chip may be inserted into a socket (commonly referred to as a burn-in socket), this socket holds the chip in place while providing electrical continuity from the chip to a printed circuit board (PCB).

Burn-in sockets are generally soldered to the printed circuit boards. The solder can be used to electrically and mechanically secure the socket to the printed circuit board. The burn-in socket (BIS) may include contact pins. The length of the contact pin that protrudes from the bottom of the socket into the PCB for soldering is called a solder-tail. When a socket is de-soldered from a PCB, solder remnants are left on the solder-tail. These solder remnants may reduce the reliability of the socket, and/or increase the diameter of the contact pin, making it difficult to reuse the socket.

In order to remove the socket, the solder may be reheated, which can damage the socket and reduce its reliability when reused. In addition, the reheating process may affect adjacent sockets. Further, soldering may cause thermal stress which may lead to plastic deformation. Finally, desoldering may cause solder bridging of solder remnants on the socket solder-tails.

BRIEF DESCRIPTION OF THE DRAWINGS

FIG. 6 is a cross-sectional side view of plating layers that may be included in an embodiment of the invention.

FIG. 7 is a top view of another embodiment of the invention.

FIG. 8 is a top view of another embodiment of the invention.

FIGS. 14–17 are side views illustrating other embodiments of the invention.

DETAILED DESCRIPTION

In the following detailed description, reference is made to the accompanying drawings that form a part hereof, and in which are shown by way of illustration specific embodiments in which the invention may be practiced. It is to be understood that other embodiments may be utilized and structural changes may be made without departing from the scope of the present disclosure.

To address these needs, for example, an embodiment of a printed circuit board assembly may include a printed circuit board, a socket having a pin, and a contact element securing the pin to the printed circuit board. Advantageously, the socket may be removed without damaging the socket or adjacent sockets. The socket can be removably secured to the printed circuit board without the use of solder.

Figure 1:
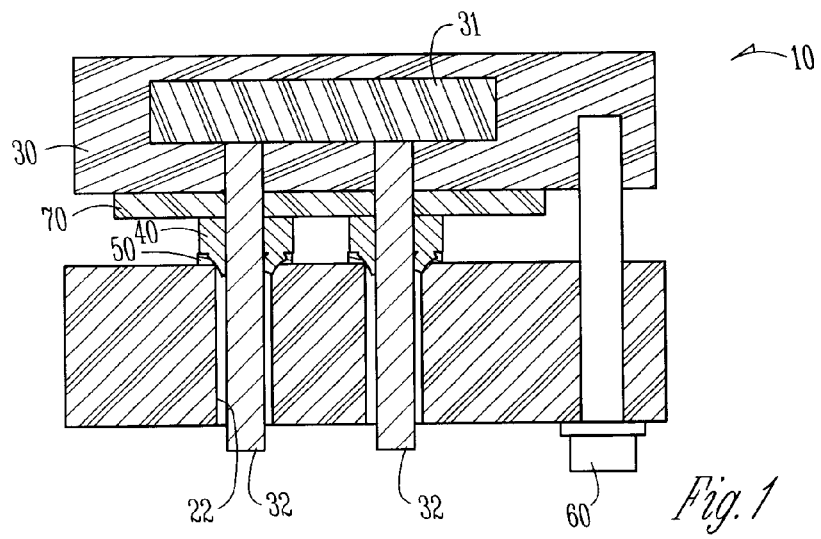
FIG. 1 is a side view of an embodiment of the invention including a printed circuit board assembly with a mounted socket.

FIG. 1 shows an exemplary circuit board assembly 10. The assembly 10 may include a circuit board 20 having at least one via 22. The circuit board 20 can ultimately be electrically connected to a device or chip 31 under test held in a burn-in socket 30 with at least one pin 32 carried by the socket 30. A contact element 40 can provide electrical continuity between the pin 32 of the burn-in socket 30 and the via 22 of the circuit board 20. Solder paste 50 is optionally used to improve the electrical connection between the contact 40 and the circuit board 20.

Figure 2:
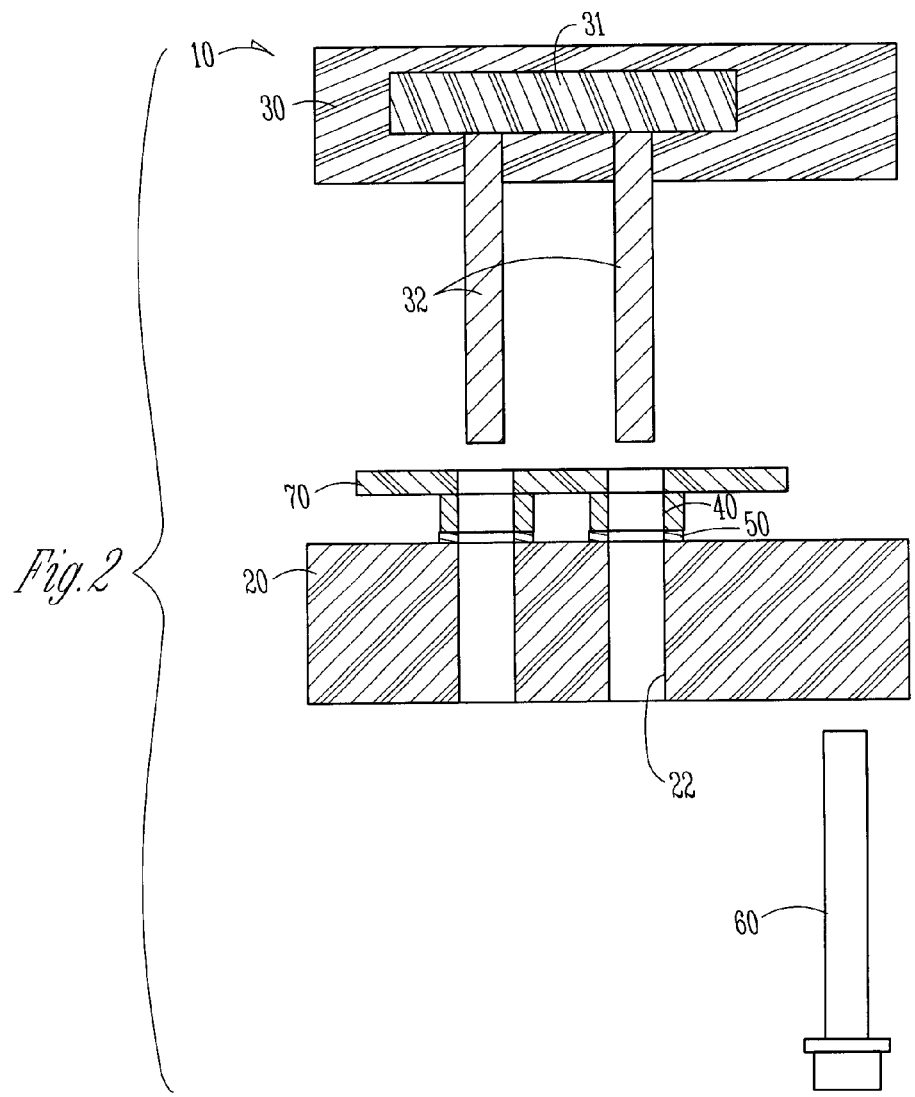
FIG. 2 is a side view of an embodiment of the invention including a printed circuit board assembly with an unmounted socket.

FIG. 2 shows circuit board assembly 10 with the pins 32 of the burn-in socket 30 disconnected from the circuit board 20. A number of contact elements 40 can be inserted or attached to each via 22 of circuit board 20 to mate with a pin grid array of pins 32 of the burn-in socket 30. Burn-in socket 30 may be attachable to and removable from the circuit board 20 without subjecting the circuit board assembly 10 to wave soldering. No soldering may be required to secure electrical connectivity between the socket pins and the burn-in socket, as will be described in detail below. Mounting and removal processes of the burn-in socket may thus be simplified. No heat may be needed to remove the burn-in socket from the circuit board. The burn-in socket 30 may also be secured to the circuit board 20 by using fasteners 60. The burn-in sockets 30 may be used in conjunction with another circuit board. Since no soldering equipment may be necessary, shorter replacement times are possible. In addition, individual, damaged, or defective burn-in sockets may be replaced without affecting adjacent areas of the circuit board 20.

Figure 3:
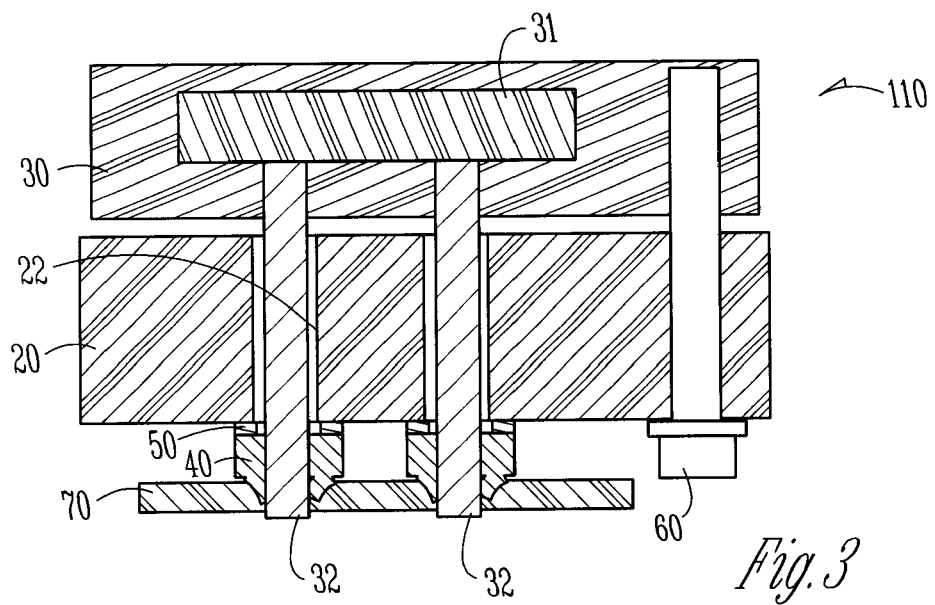
FIG. 3 is a side view of an embodiment of the invention including a printed circuit board assembly.

FIG. 3 shows another embodiment of circuit board assembly 110 with the contact element 40 located beneath the printed circuit board 20 instead of between the printed circuit board and the burn-in socket as shown in FIGS. 1 and 2. Optionally, a contact element sheet 70 may be used to locate the contact elements 40 for receiving the pins 32. The contact element sheet 70 can be a high temperature resistant adhesive sheet, for example, such as KAPTON™ tape, for securing the contacts 40 in position.

Figure 4:
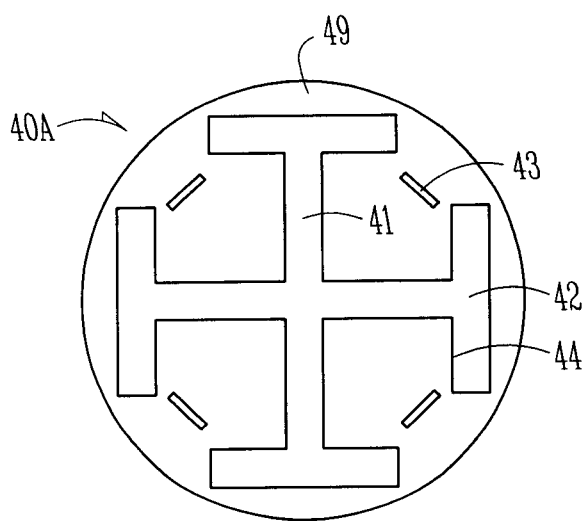
FIG. 4 is a top view of an embodiment of the invention.
Figure 5:
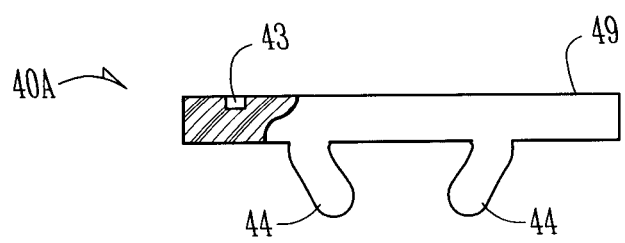
FIG. 5 is a side view of a contact element according to an embodiment of the invention.

Referring to FIGS. 4 and 5, contact element 40A may be a disk 49 which includes large cuts 41, small cuts 42, and grooves 43 formed in the disk 49 to provide an opening for a contact pin to pass through. The disk 49 may be formed from a plated metal sheet 80 as further described in FIG. 6. The disk 49 is shown as but not limited to a circular shape; other shapes such as square or rectangular for example may also be used. As shown, four large cuts 41 meet at the center of the disc 49, forming a cross. A small cut 42 may be located at each end of the cross, forming a T shape out of each of four legs of the cross. The base of each of the T shapes can meet at the center of the disk 49 to form four fingers 44. Optionally, grooves 43 can be formed at the point where the fingers 44 connect to the circular disk 49 between the top outer ends of each of the T shapes. Grooves 43 are channels formed in one side of the disk 49 that do not pass all the way through the disk 49. The grooves 43 may operate to reduce the force needed to deflect fingers 44 as the pin is inserted through the contact element 40A.

As shown in FIG. 6, the plated metal sheet 80 may be comprised of, but not limited to a base 82 of Beryllium Copper (BeCu) with inside layers 84 of nickel (Ni) and outside layers 86 of gold (Au).

FIGS. 7 and 8 show additional embodiments of a contact element 40. FIG. 7 depicts contact element 40B formed from a disk 49 with a round cut 45 and a plurality of extension cuts 46 formed in a circular shaped disk. Optionally, grooves 43 are formed in the disk 49 between the extension cuts 46. FIG. 8 depicts contact element 40C formed from a disk 49 with a round cut 45 and a plurality of extension cuts 46 formed in the circular shaped disk. Optionally, grooves 43 are formed in the disk 49 between the extension cuts 46.

Figure 9:
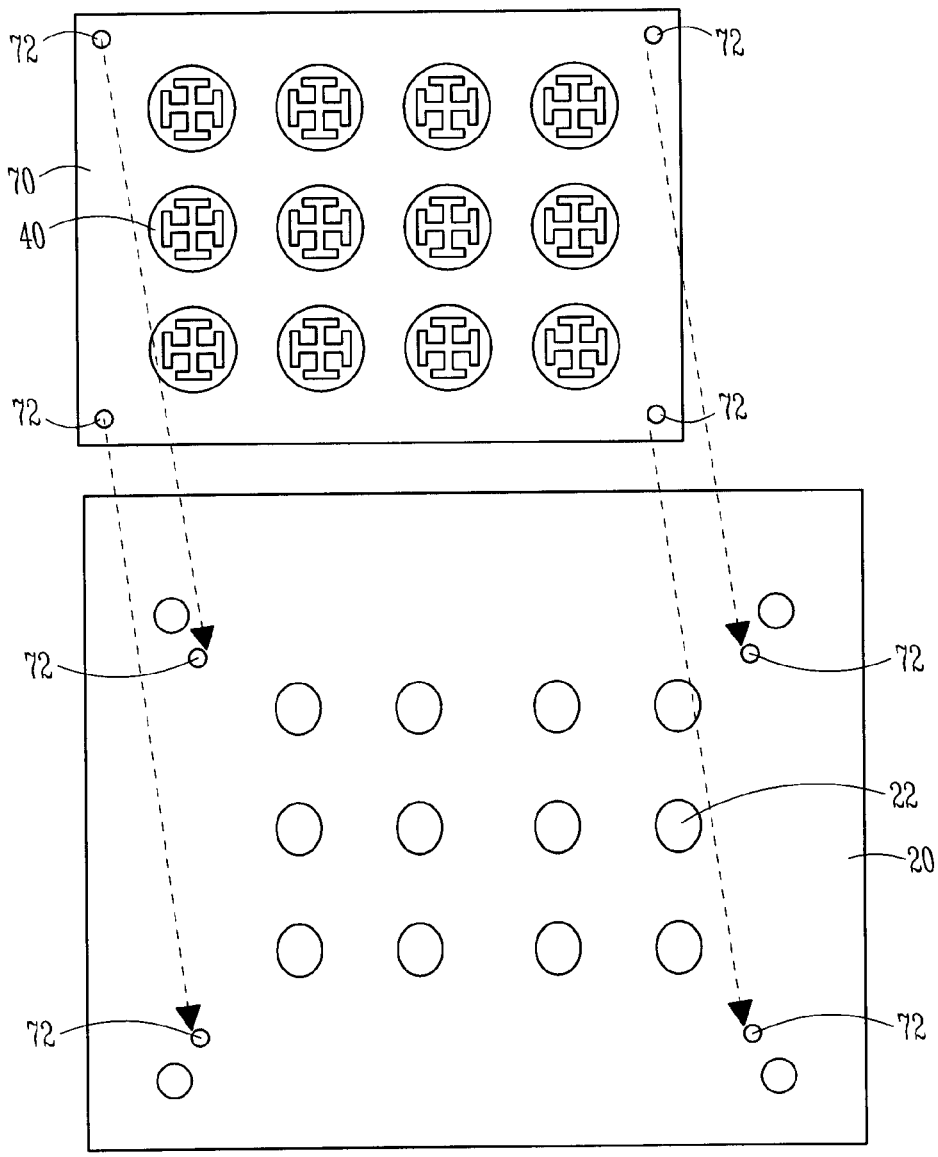
FIG. 9 is an exploded perspective view of an embodiment of the invention, including a contact element sheet and a circuit board.

As shown in FIG. 9, a circuit board 20 with an array of vias 22 may align with a contact element sheet 70 having an array of contact elements 40. The vias 22 and contact elements 40 can be aligned using alignment pin holes 72 in the circuit board 20 that match with alignment pin holes 72 in the contact element sheet 70.

Figure 10:
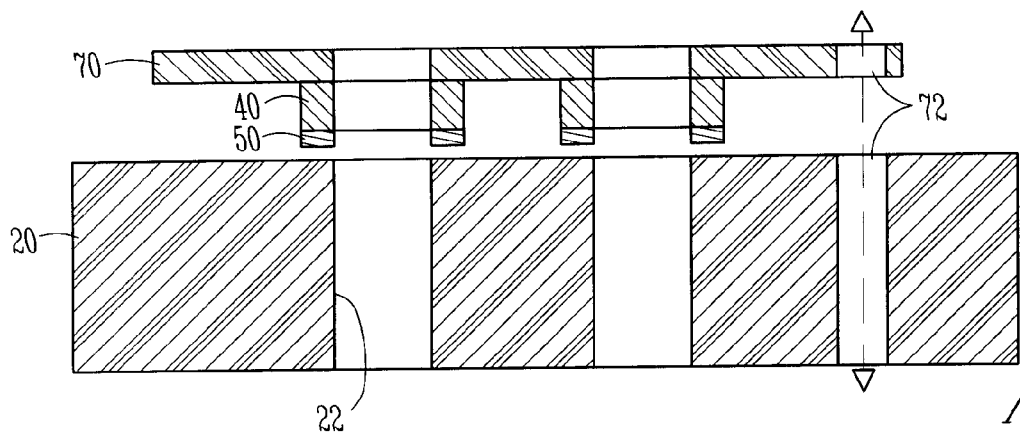
FIG. 10 is a side view of a circuit board and contact element sheet, according to an embodiment of the invention.

As shown in FIG. 10, a cross sectional view of the contact element sheet 70 and contact elements 40 located adjacent to and aligned with the circuit board 20 using the alignment pin holes 72. Optionally, solder paste 50 is placed on the contact elements 40, however, the solder paste 50 may also be placed on the circuit board 20 prior to positioning the contact elements 40 on the circuit board 20.

Figure 11:
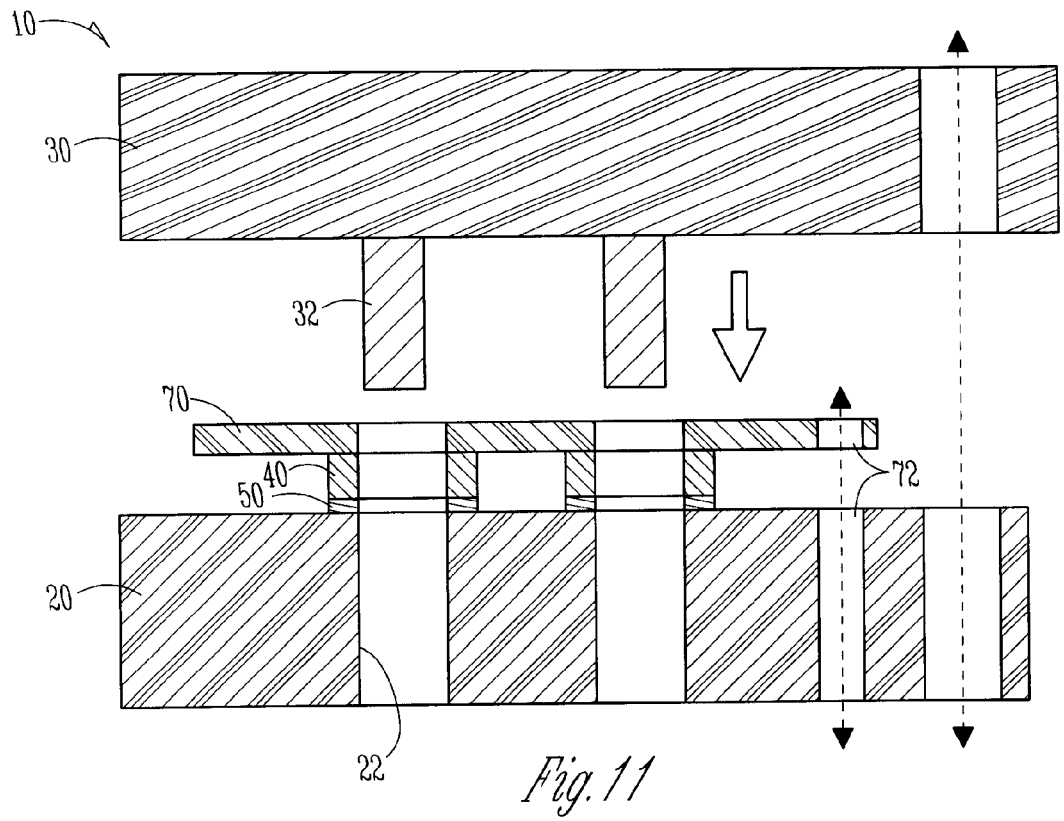
FIG. 11 is a side view of a disassembled circuit board according to an embodiment of the invention.

FIG. 11 shows the circuit board assembly 10 disassembled and aligned for assembly. The alignment pin holes 72 of the contact element sheet 70 may align with the alignment pin holes 72 of the circuit board 20. The socket pins 32 may align with the vias 22 in the circuit board 20.

Figure 12:
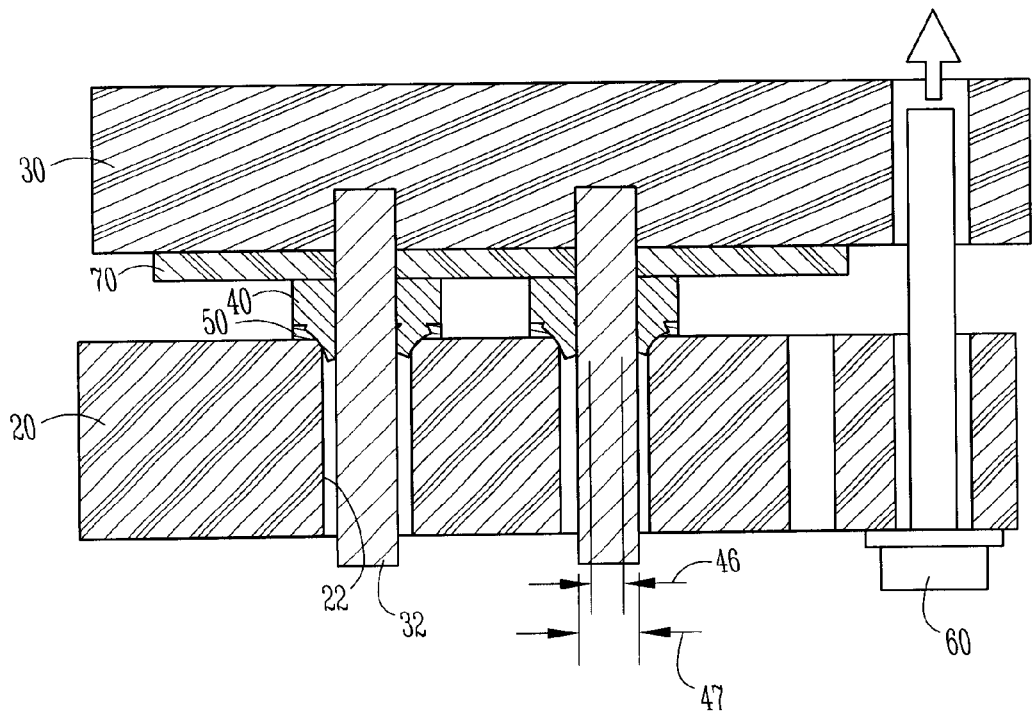
FIG. 12 is a side view of an embodiment of the invention, including a circuit board assembly.

FIG. 12 shows an assembled circuit board assembly 10. The pins 32 can be inserted in the vias 22 and the fingers 44 of the contact elements 40 may be displaced to allow passage of the pin 32 through the contact element 40. The contact element 40 can provide electrical and mechanical continuity between the pins 32 and the via 22 of the circuit board 20. The fingers 44 can be forced open as the pin 32 is inserted. The spring effect or resiliency of the contact element 40 can provide frictional contact and electrical contact between the contact element 40 and pin 32. The fingers 44 may assume a first inside diameter 46 and a second inside diameter 47. The first inside diameter 46 of the fingers 44 is less than the diameter of the pin 32. The second inside diameter 47 of the fingers 44 may be substantially equal to the diameter of the pin 32. The socket 30 is secured to the circuit board 20 with a fastener 60.

The circuit board assembly 10 may include a circuit board 20 having at least one via 22. The circuit board 20 may electrically connect to a burn-in socket 30 with at least one pin 32. A contact element 40 may provide electrical continuity between the pin 32 of the burn-in socket 30 and the via 22 of the circuit board 20. Optionally, a number of contact elements 40 can be inserted or attached to each via 22 of circuit board 20 to mate with a pin grid array of pins 32 of the burn-in socket 30. Burn-in socket 30 can be attachable and removable from the circuit board 20 without subjecting the circuit board assembly 10 to wave soldering. No soldering may be required to secure electrical connectivity between the socket pins 32 and the circuit board 20. Mounting and removal processes of the burn-in socket 30 can then be simplified. No heat may be needed to remove the burn-in socket 30. The burn-in socket 30 may also be secured to the circuit board 20 by using at least one fastener 60. The burn-in socket 30 may be used on another circuit board with a new set of contact elements. Since no soldering equipment is necessary, shorter replacement times are possible. In addition, individual, damaged, or defective burn-in sockets are easily replaceable without affecting adjacent areas of the circuit board 20.

Figure 13:
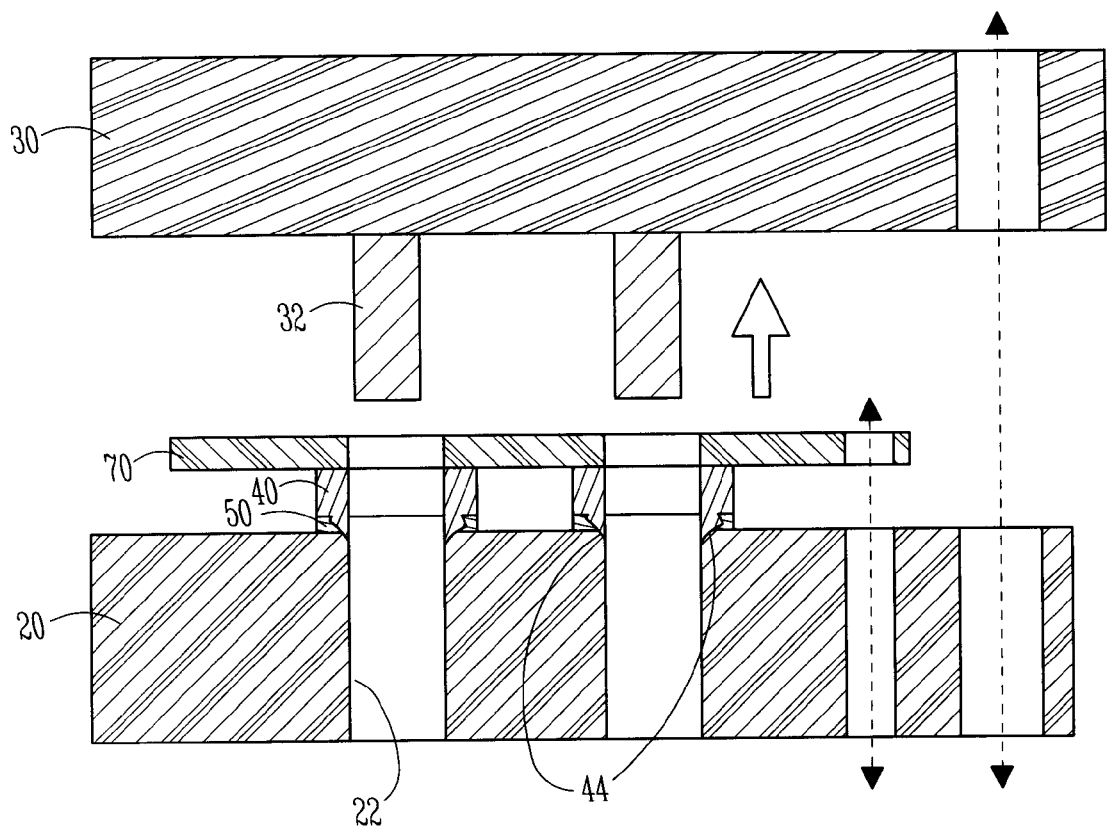
FIG. 13 is a side view of an embodiment of the invention, including a disassembled circuit board and contact elements.

FIG. 13 shows the circuit board assembly 10 disassembled. The socket 30 may be removed from the circuit board 20 without heating the circuit board 20 or the use of wave solder equipment. The fastener 60 is removed and the socket 30 is released from circuit board 20. The contact elements 40 deform to release the pins 32 from the contact elements 40.

As shown in FIGS. 14–17, another embodiment of contact element 40D is press fit into the via 22 of the circuit board 20. The outside diameter of the contact element 40D is substantially equal to the diameter of the via 22 so that the contact element 40D can be press fit into the via 22. Press fitting the contact element 40D into the via 22 may provide electrical and mechanical contact between the via 22 and the contact element 40D.

As shown in FIG. 16, pin 32 is inserted through contact element 40D forcing the fingers 44 of contact element 40D to spread apart. The spring effect or resiliency of the contact element 40D may provide frictional contact and electrical contact between the contact element 40D and pin 32.

The plurality of fingers 44 have a first inside diameter 46 as shown in FIG. 16 and a second inside diameter 47 as shown in FIG. 17. The first inside diameter 46 of the plurality of fingers 44 is less than the diameter of the pin 32. The second inside diameter 47 of the plurality of fingers 44 is substantially equal to the diameter of the pin 32.

As shown in FIGS. 14–17, the contact element 40D includes a lip portion 91 and a tapered portion 92. The lip portion 91 has an outside diameter greater than an inside diameter of a via 22 and an opening greater than the outside diameter of a pin 32. The tapered portion 92 has an outside diameter less than the inside diameter of the via 22 and a first inside diameter 46 less than the outside diameter of the pin 32. The tapered portion 92 can be deformable, such that upon insertion of the pin 32, the tapered portion 92 is deflectable to a second inside diameter 47 substantially equal to the outside diameter of the pin 32.

Figure 18:
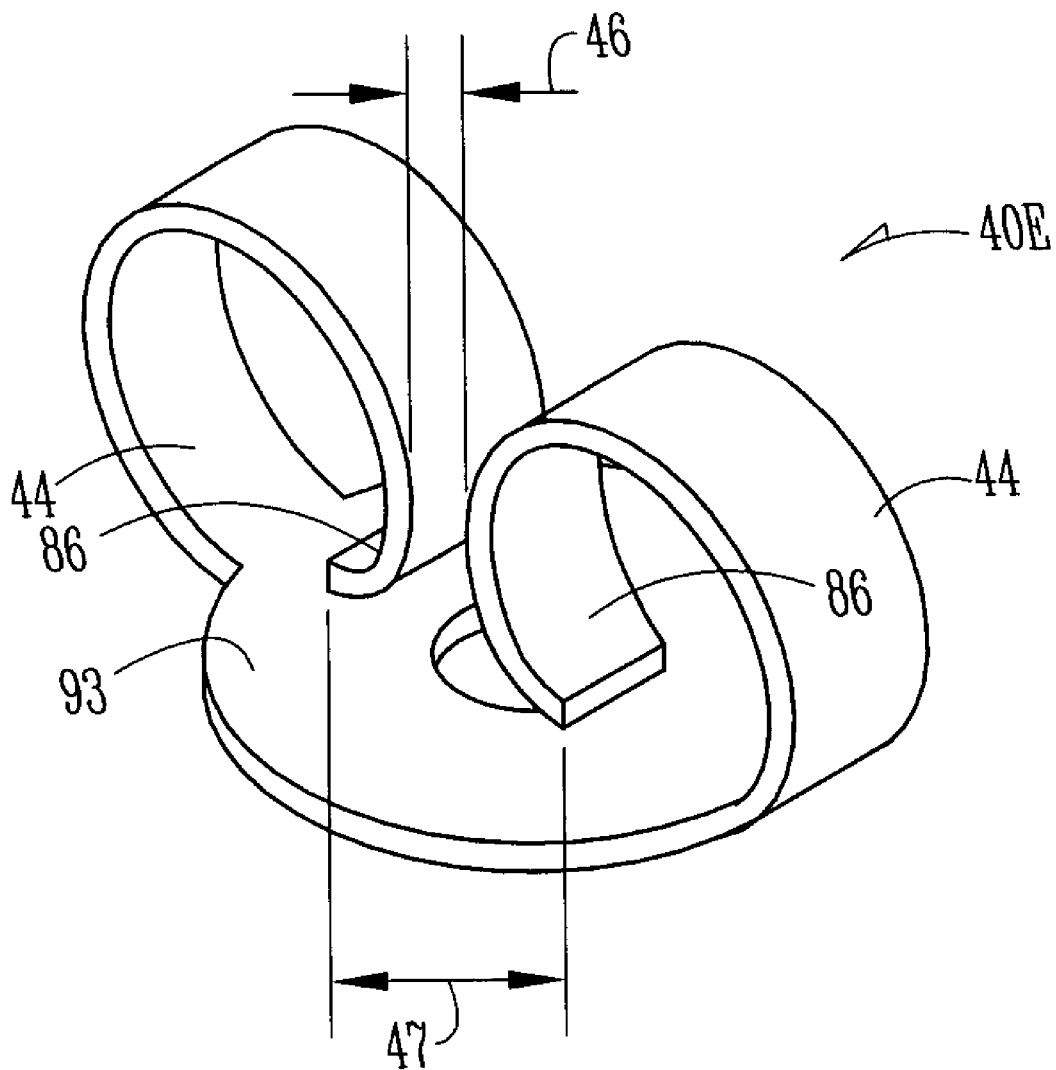
FIG. 18 is a perspective view of another embodiment of the invention.

An additional embodiment of contact element 40 is shown in FIG. 18. The contact element 40E may have a plurality of fingers 44. These fingers 44 are inwardly extending fingers 100. The plurality of fingers 44 can deflect to provide a first inside diameter 46 and a second inside diameter 47. The first inside diameter 46 of the plurality of fingers may be less than the diameter of the pin 32. The second inside diameter 47 of the plurality of fingers 44 may be substantially equal to the diameter of the pin 32. The spring effect or resiliency of the contact element 40E can provide frictional contact and electrical contact between the contact element 40E and pin 32.

As shown in FIG. 18, the contact element 40E can include a base portion 93 and a plurality of fingers 44. The base portion 93 may have an outside diameter greater than the inside diameter of the via 22, and the base portion 93 may have an opening greater than the outside diameter of the pin 32. The plurality of fingers 44 can form a first inside diameter 46 less than the outside diameter of a pin 32. The plurality of fingers 44 may be deformable, such that upon insertion of the pin 32, the plurality of fingers 44 are deflectable to a second inside diameter 47 substantially equal to the outside diameter of the pin 32.

An exemplary method of securing a pin to a via in a circuit board may include placing a contact element adjacent to the via, inserting the pin through the contact element, deforming the contact element, and providing an electrical and mechanical connection between the pin and the via with the contact element. Alternatively, the contact element can be attached to the via by infrared reflow. Optionally, the method includes removing the pin from the via without heating the pin and via.

Advantageously, the circuit board assembly can provide a contact element that allows the socket to be removed from the printed circuit board without damaging the socket, adjacent sockets, or the printed circuit board. The socket may be removably secured to the printed circuit board with a replaceable contact element without the use of solder.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

It is emphasized that the Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

What is claimed is:

1. An assembly, comprising:
    a circuit board; and
    a contact element attached to the circuit board, the contact element having a disk, a plurality of cuts formed in the disk to define a plurality of fingers connected to the disk, and at least one groove formed in the disk as a channel which does not pass completely through the disk, wherein the at least one groove is formed in the disk at a point where one of the plurality of fingers is connected to the disk.

2. The assembly of claim 1, wherein each one of the plurality of fingers resiliently deform from assuming a first diameter to assuming a second diameter when a pin is inserted between the plurality of fingers.

3. The assembly of claim 1, wherein the plurality of cuts includes a round cut and at least one extension cut.

4. The assembly of claim 1, wherein the plurality of cuts includes at least one T-shaped cut.

5. The assembly of claim 1, wherein the disk includes a lip portion having an outside diameter greater than an inside diameter of a via on the circuit board into which the contact element is inserted, and wherein the disk has an opening having an inside diameter greater than an outside diameter of a pin which is inserted between the plurality of fingers.

6. The assembly of claim 1, wherein the disk includes a tapered portion having an outside diameter less than an inside diameter of a via on the circuit board into which the contact element is inserted, and a first inside diameter less than an outside diameter of a pin which is inserted between the plurality of fingers.

7. The assembly of claim 1, wherein the disk is plated.

8. The assembly of claim 1, wherein the disk includes a lip portion having an outside diameter greater than an inside diameter of a via attached to the circuit board.

9. The assembly of claim 1, wherein the contact element is formed from a sheet of plated metal.

10. The assembly of claim 1, further comprising:
    a socket attached to the contact element.

11. The assembly of claim 1, further comprising:
    a contact sheet attached to the contact element.

12. An assembly, comprising:
    a contact sheet; and
    a contact element attached to the contact sheet, the contact element having a disk, a plurality of cuts formed in the disk to define a plurality of fingers connected to the disk, and at least one groove formed in the disk as a channel which does not pass completely through the disk, wherein the at least one groove is formed in the disk at a point where one of the plurality of fingers is connected to the disk.

13. The assembly of claim 12, wherein the plurality of cuts includes a round cut and at least one extension cut.

14. The assembly of claim 12, wherein the plurality of cuts includes at least one T-shaped cut.

15. The assembly of claim 12, further comprising:
    a socket attached to the contact element.

16. A method, comprising:
    inserting a pin between a plurality of fingers attached to a contact element attached to a circuit board, the contact element having a disk, a plurality of cuts formed in the disk to define a plurality of fingers connected to the disk, and at least one groove formed in the disk as a channel which does not pass completely through the disk, wherein the at least one groove is formed in the disk at a point where one of the plurality of fingers is connected to the disk; and
    deforming the plurality of fingers from a first inside diameter less than an outside diameter of the pin to assume a second inside diameter substantially equal to the outside diameter of the pin.

17. The method of claim 16, further comprising:
    placing the contact element adjacent to a via attached to the circuit board.

18. The method of claim 16, further comprising:
    placing the contact element adjacent to an adhesive contact element sheet.

19. The method of claim 16, further comprising:
    attaching the contact element to the circuit board using infra-red reflow.

20. A method, comprising:
    inserting a pin between a plurality of fingers attached to a contact element attached to a contact sheet, the contact element having a disk, a plurality of cuts formed in the disk to define a plurality of fingers connected to the disk, and at least one groove formed in the disk as a channel which does not pass completely through the disk, wherein the at least one groove is formed in the disk at a point where one of the plurality of fingers is connected to the disk; and deforming the plurality of fingers from a first inside diameter less than an outside diameter of the pin to assume a second inside diameter substantially equal to the outside diameter of the pin.

21. The method of claim 20, further comprising:

placing the contact element adjacent to a circuit board.

22. The method of claim 20, further comprising:

placing the contact element adjacent to a socket.

* * * * *